United States Patent
Ueno et al.

(10) Patent No.: US 9,376,056 B2
(45) Date of Patent: Jun. 28, 2016

(54) POWER SUPPLY DEVICE AND ILLUMINATION DEVICE FOR VEHICLE USING SAME

(71) Applicant: Panasonic Intellectual Property Management Co., Ltd., Osaka (JP)

(72) Inventors: Masatoshi Ueno, Osaka (JP); Toshiaki Nakamura, Osaka (JP); Kazuya Kato, Osaka (JP); Masashi Kichima, Niigata (JP); Masahiro Nishikawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/438,623

(22) PCT Filed: Oct. 29, 2013

(86) PCT No.: PCT/JP2013/006409
§ 371 (c)(1),
(2) Date: Apr. 26, 2015

(87) PCT Pub. No.: WO2014/068966
PCT Pub. Date: May 8, 2014

(65) Prior Publication Data
US 2015/0291088 A1    Oct. 15, 2015

(30) Foreign Application Priority Data
Oct. 31, 2012   (JP) ................... 2012-240815

(51) Int. Cl.
*H05B 37/02*     (2006.01)
*H05B 39/04*     (2006.01)
(Continued)

(52) U.S. Cl.
CPC .. *B60Q 3/00* (2013.01); *H02H 3/16* (2013.01); *H02H 3/243* (2013.01); *H02H 7/122* (2013.01);
(Continued)

(58) Field of Classification Search
CPC ........ H05B 37/02; H05B 39/04; H05B 41/16; H03L 7/06
USPC ................ 315/362, 307, 247, 224, 289, 291, 315/DIG. 5, DIG. 7
See application file for complete search history.

(56) References Cited

U.S. PATENT DOCUMENTS 5,942,859 A * 8/1999 Okude ............... H05B 41/2855
                                                    315/209 R
6,232,728 B1 * 5/2001 Yamamoto ........... H05B 41/042
                                                    315/291
(Continued)

FOREIGN PATENT DOCUMENTS

JP       06-013232 A    1/1994
JP    2003-199356 A    7/2003
(Continued)

OTHER PUBLICATIONS

International Search Report for corresponding International Application No. PCT/JP2013/006409 mailed Dec. 10, 2013.
(Continued)

*Primary Examiner* — Thai Pham
*Assistant Examiner* — Wei Chan
(74) *Attorney, Agent, or Firm* — Renner, Otto, Boisselle & Sklar, LLP

(57) ABSTRACT

A power supply device includes a DC power supply circuit configured to output DC power, and a ground-fault determining circuit configured to determine presence or absence of a ground fault at a post-stage of the DC power supply circuit. The ground-fault determining circuit includes a capacitor having an end that is connected with ground, and a diode including an anode and a cathode. The anode is connected with another end of the capacitor, and the cathode is connected with an output end on a high voltage side of the DC power supply circuit. The ground-fault determining circuit further includes a constant voltage source configured to charge the capacitor with a prescribed charging voltage, and a comparator as a determining portion configured to determine presence of the ground fault when a voltage across the capacitor falls below a prescribed determination reference voltage lower than the prescribed charging voltage.

12 Claims, 13 Drawing Sheets

(51) Int. Cl.
  *H05B 41/16* (2006.01)
  *B60Q 3/00* (2006.01)
  *H02M 7/48* (2007.01)
  *H02H 3/24* (2006.01)
  *H02H 7/122* (2006.01)
  *H02H 3/16* (2006.01)
  *H02M 3/155* (2006.01)
  *H02M 1/00* (2006.01)
  *G01R 31/02* (2006.01)

(52) U.S. Cl.
  CPC .............. *H02H 7/1225* (2013.01); *H02M 7/48* (2013.01); *G01R 31/025* (2013.01); *H02M 3/155* (2013.01); *H02M 2001/007* (2013.01)

(56) References Cited

U.S. PATENT DOCUMENTS

| | | |
|---|---|---|
| 6,441,713 B1 | 8/2002 | Okuchi et al. |
| 2002/0047639 A1 | 4/2002 | Okuchi et al. |
| 2003/0111969 A1* | 6/2003 | Konishi ............. H05B 41/2881 315/291 |
| 2011/0068714 A1* | 3/2011 | Komatsu ............ H05B 41/2886 315/307 |

FOREIGN PATENT DOCUMENTS

| | | |
|---|---|---|
| JP | 3480307 B2 | 10/2003 |
| JP | 2005-224049 A | 8/2005 |

OTHER PUBLICATIONS

Form PCT/ISA/237 for corresponding International Application No. PCT/JP2013/006409 dated Dec. 10, 2013.

* cited by examiner

POWER SUPPLY DEVICE AND ILLUMINATION DEVICE FOR VEHICLE USING SAME

TECHNICAL FIELD

The invention relates to a power supply device and an illumination device for vehicle using the same.

BACKGROUND ART

Conventionally, there has been provided a power supply device with a DC power supply circuit configured to output DC power, which is configured to determine whether or not a ground fault has occurred at a post-stage of the DC power supply circuit, and stop an output from the DC power supply circuit when occurrence of the ground fault is determined (e.g., see JP 3480307 B2).

Here, an output voltage from the DC power supply circuit is decreased according to the occurrence of the above-mentioned ground fault. Therefore, as a method for determining the occurrence of the ground fault, it is considered that the occurrence of the ground fault is determined when the output voltage from the DC power supply circuit falls below a prescribed reference voltage.

However, when the DC power supply circuit performs constant power operation or constant current operation, the output voltage from the DC power supply circuit is changed even while the ground fault is absent. Accordingly, erroneous determination may be easily caused, if determining presence or absence of the ground fault, using only the output voltage from the DC power supply circuit.

Conventionally, in order to prevent the erroneous determination, an output current from the DC power supply circuit is used for determination in addition to the output voltage from the DC power supply circuit. Stop of the output is further maintained only in a case where the ground fault is still detected even when operation, in which the output is restarted after temporarily stopped according to detection of the ground fault, is repeated during a prescribed period.

In the conventional example as above, there is a possibility that an overcurrent is generated when the output is restarted within the prescribed period, and accordingly fusing of a fuse occurs.

DISCLOSURE OF THE INVENTION

It is an object of the invention to provide a power supply device and an illumination device for vehicle using the same, which can suppress erroneous determination of a ground fault.

A power supply device of the invention includes a DC power supply circuit and a ground-fault determining circuit. The DC power supply circuit is configured to output DC power. The ground-fault determining circuit is configured to determine presence or absence of a ground fault at a post-stage of the DC power supply circuit. The ground-fault determining circuit includes a capacitor, a diode, a determining portion, and a constant voltage source. The capacitor has an end that is connected with ground. The diode includes an anode and a cathode. The anode is connected with another end of the capacitor, and the cathode is connected with an output end on a high voltage side of the DC power supply circuit. The determining portion is configured to determine the presence or absence of the ground fault based on a voltage across the capacitor. The constant voltage source is configured to charge the capacitor with a prescribed charging voltage. The prescribed charging voltage is lower than an output voltage from the DC power supply circuit in a state where the ground fault is absent and power supplying is normally performed from the DC power supply circuit to a load. The determining portion is configured to determine the presence of the ground fault when the voltage across the capacitor falls below a prescribed determination reference voltage that is lower than the prescribed charging voltage.

Preferably, when the ground-fault determining circuit determines the presence of the ground fault, the power supply device is configured to stop the power supplying from the DC power supply circuit to the load.

In the power supply device, the prescribed charging voltage may be higher than a minimum value of an output voltage from the DC power supply circuit in a state where the ground fault is present at the post-stage of the DC power supply circuit.

Preferably, the power supply device further includes a resistor for charging, and a resistor for discharging. In this case, preferably, the resistor for charging is electrically connected across the constant voltage source and the capacitor, and the resistor for discharging is connected in series with the diode, and the resistor for charging has a resistance value higher than a resistance value of the resistor for discharging.

The power supply device may further include a cut-off circuit configured to cut off the power supplying from the DC power supply circuit to the load, when the ground-fault determining circuit determines the presence of the ground fault.

In the power supply device, the cut-off circuit may include a switching element electrically connected between the DC power supply circuit and the load. In this case, the power supply device may further include a control circuit and an off-switching circuit. The control circuit is configured to output a prescribed control voltage to a control terminal of the switching element so as to turn on the switching element. The off-switching circuit is configured to reduce a potential of the control terminal of the switching element so as to turn off the switching element, when the ground-fault determining circuit determines the presence of the ground fault. The prescribed determination reference voltage depends on the prescribed control voltage.

In the power supply device, the cut-off circuit may include a full bridge inverter circuit that includes four switching elements.

An illumination device for vehicle of the invention includes any one of the above-mentioned power supply devices, and a light source of emitting light with an output from the power supply device.

According to the invention, because the voltage across the capacitor is more stable than the output voltage from the DC power supply circuit, it is possible to more suppress erroneous determination of the ground fault, compared with a case of directly comparing the output voltage from the DC power supply circuit with a reference voltage to determine the presence or absence of the ground fault.

BRIEF DESCRIPTION OF THE DRAWINGS

Preferred embodiments of the invention will now be described in further details. Other features and advantages of the invention will become better understood with regard to the following detailed description and accompanying drawings where.

BEST MODE FOR CARRYING OUT THE INVENTION

Hereinafter, best mode for carrying out the invention will be described with reference to drawings.

Figure 1:
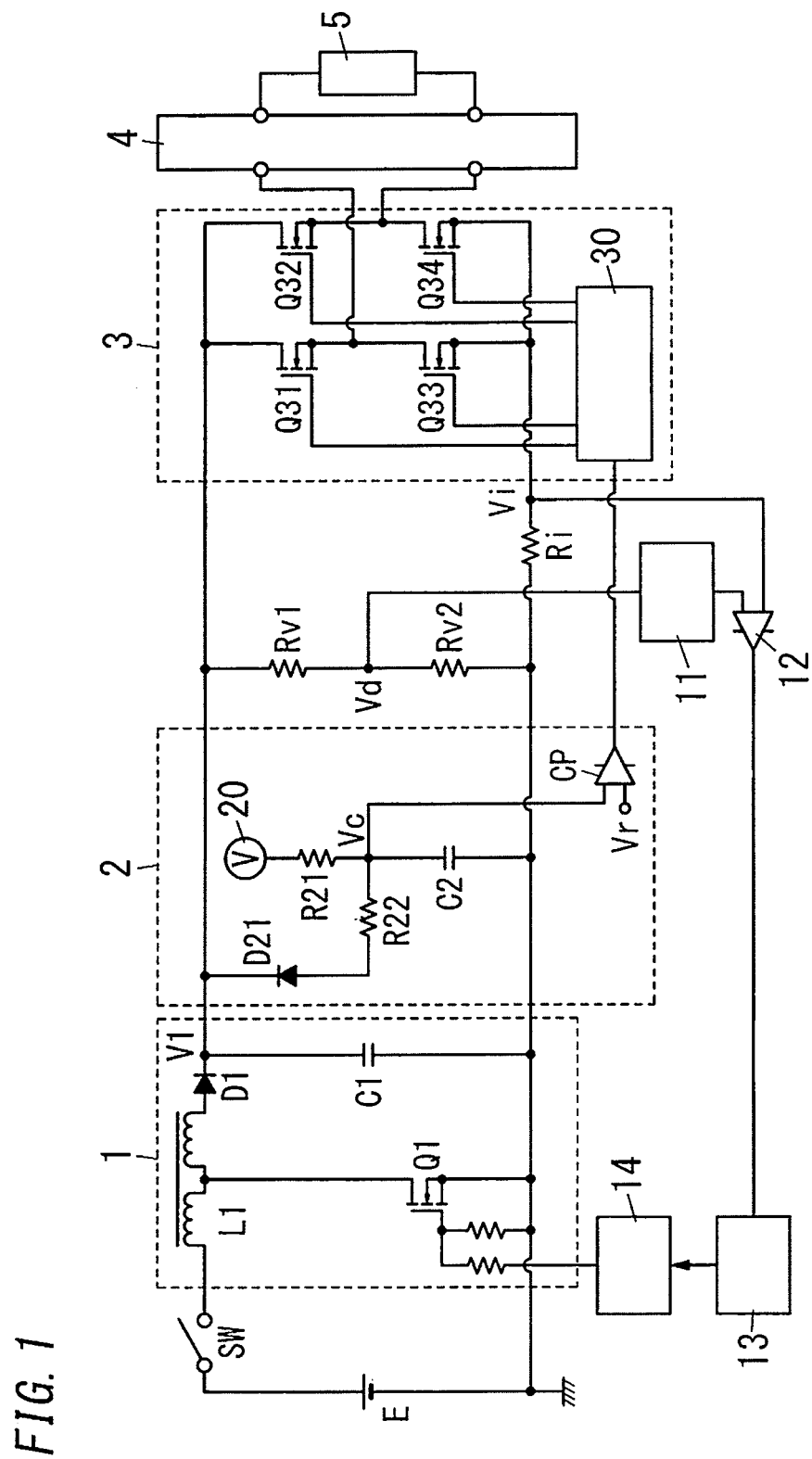
FIG. 1 is a circuit block diagram illustrating a power supply device of an embodiment.

As shown in FIG. 1, a power supply device of the embodiment includes a DC power supply circuit 1 and a ground-fault determining circuit 2. The DC power supply circuit 1 is configured to output DC power. The ground-fault determining circuit 2 is configured to determine presence or absence of a ground fault at a post-stage of the DC power supply circuit 1 (hereinafter, referred to as the "ground fault" simply).

The DC power supply circuit 1 includes a series circuit of an inductor L1, a diode D1 and a capacitor C1. The series circuit is connected between both ends of a DC power supply E via a power supply switch SW. The inductor L1 includes a tap, and is a so-called autotransformer in which the whole functions as a secondary winding, and a portion on a side of DC power supply E from the tap functions as a primary winding. The DC power supply circuit 1 further includes a switching element Q1 that is electrically connected between the tap of the inductor L1 and an output end on a low voltage side of the DC power supply E. In other words, the DC power supply circuit 1 is a well-known boost converter, of which output ends correspond to both ends of the capacitor C1. The output end on the low voltage side of the DC power supply E and an output end on a low voltage side of the DC power supply circuit 1 are connected with ground.

Further, a circuit of voltage dividing resistors Rv1 and Rv2 is connected across output ends of the DC power supply circuit 1 so as to generate an output dividing voltage Vd by dividing an output voltage V1 from the DC power supply circuit 1. In addition, a current detecting resistor Ri is connected between the output ends of the DC power supply circuit 1 so as to generate a current detecting voltage Vi that is proportional to an output current from the DC power supply circuit 1.

The DC power supply circuit 1 is subjected to feedback control so that output power reaches prescribed target power, based on the output dividing voltage Vd and the current detecting voltage Vi. Specifically, the power supply device of the embodiment includes a reference voltage generating portion 11 and an error output portion 12. The reference voltage generating portion 11 is configured to generate a reference voltage corresponding to a target value for the output current. The error output portion 12 is configured to output a higher voltage as the current detecting voltage Vi is lower with respect to the reference voltage. The reference voltage generating portion 11 is configured to generate the reference voltage proportional to the target power, and inversely proportional to the output dividing voltage Vd. The power supply device of the embodiment further includes a PWM generating portion 13 and a drive portion 14. The PWM generating portion 13 is configured to generate a rectangular wave (a PWM wave) with a higher duty ratio, as an output voltage from the error output portion 12 is higher. The drive portion 14 is configured to drive the switching element Q1 of the DC power supply circuit 1 according to an output from the PWM generating portion 13. The drive portion 14 is configured to hold the switching element Q1 in an ON state while the output from the PWM generating portion 13 is at a high level, and in an off state while the output from the PWM generating portion 13 is at a low level. In other words, as the output power from the DC power supply circuit 1 is lower with respect to the target power, the duty ratio of the switching element Q1 is made higher, and accordingly, the output voltage V1 from the DC power supply circuit 1 is also made higher. Therefore, the feedback control is achieved so that the output power from the DC power supply circuit 1 reaches the target power. Because the reference voltage generating portion 11, the error output portion 12, the PWM generating portion 13 and the drive portion 14 as described above can be realized by using well-known electronic circuits, detailed drawings and explanations thereof will be omitted.

The DC power output from the DC power supply circuit 1 is converted into AC power by a full bridge inverter circuit 3 to be output to a discharge lamp 5 via an igniter circuit 4.

The igniter circuit 4 is configured to generate a high voltage for activating discharge lamp 5 at starting, and function as a mere electrically conducting path after the activating of the discharge lamp 5. Because the igniter circuit 4 can be realized by using a well-known art, such as a spark gap or a pulse transformer, detailed drawings and explanations thereof will be omitted.

Figure 2:
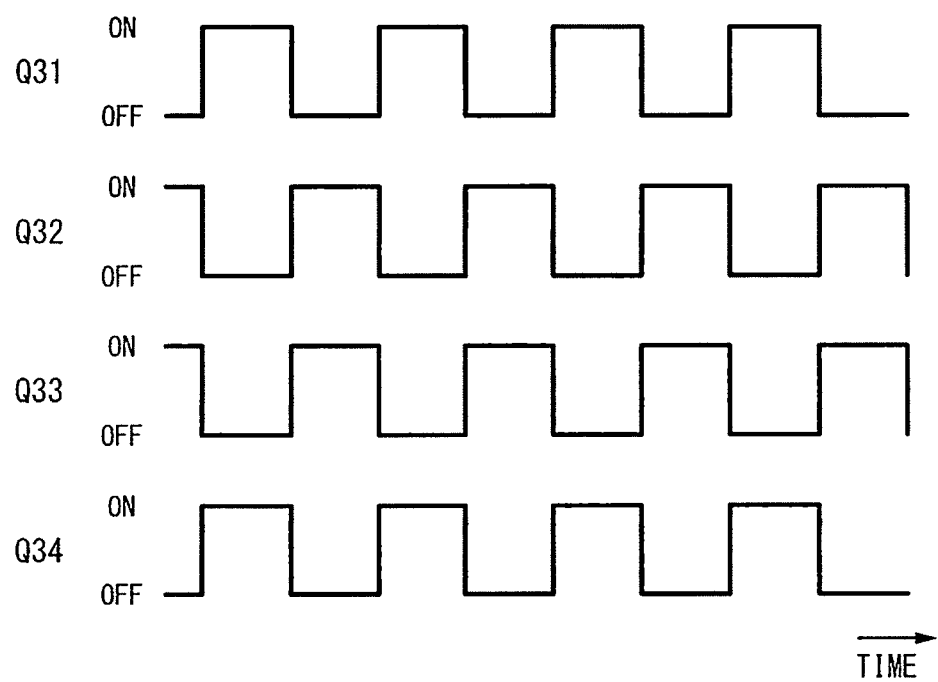
FIG. 2 is an explanatory drawing for operation of an inverter circuit in the power supply device of the embodiment.

The inverter circuit 3 includes a series circuit of two switching elements Q31 and Q33 and a series circuit of two switching elements Q32 and Q34. These series circuits are connected in parallel with each other between the output ends of the DC power supply circuit 1. The output ends of the inverter circuit 3 respectively corresponds to a connecting point of the switching elements Q31 and Q33, and a connecting point of the switching elements Q32 and Q34. The power supply device of the embodiment further includes an inverter drive circuit 30 that is configured to periodically turn on/off each of the switching elements Q31 to Q34 of the inverter circuit 3. Each of the switching elements Q31 to Q34 is a Field Effect Transistor (FET) for example. The inverter drive circuit 30 is configured to output a control voltage to gates as control terminals of the switching elements Q31 to Q34 for turning on those. As shown in FIG. 2, the inverter drive circuit 30 is configured to alternately turn on/off the switching elements Q31 and Q33 connected in series and alternately turn on/off the switching elements Q32 and Q34 connected in series so as to be periodically operated. In this case, the inverter drive circuit 30 is configured to simultaneously turn on the switching elements Q31 and Q34 positioned diagonally for each other and simultaneously turn on the switching elements Q32 and Q33 positioned diagonally for each other so as to be periodically operated. Note that although not illustrated in FIG. 2, a period, during which all of the switching elements Q31 to Q34 are in off states (a so-called dead time), is provided in order to prevent occurrence of short-circuit due to simultaneously ON states of all of the switching elements Q31 to Q34. In this case, the period is for example a few microseconds, and is provided between a ON period of a set of the switching elements Q31 and Q34 positioned diagonally for each other and a ON period of another set of the switching elements Q32 and Q33 positioned diagonally for each other. Because the inverter drive circuit 30 as described above can be realized by using a well-known art, detailed drawings and explanations thereof will be omitted.

Figure 3:
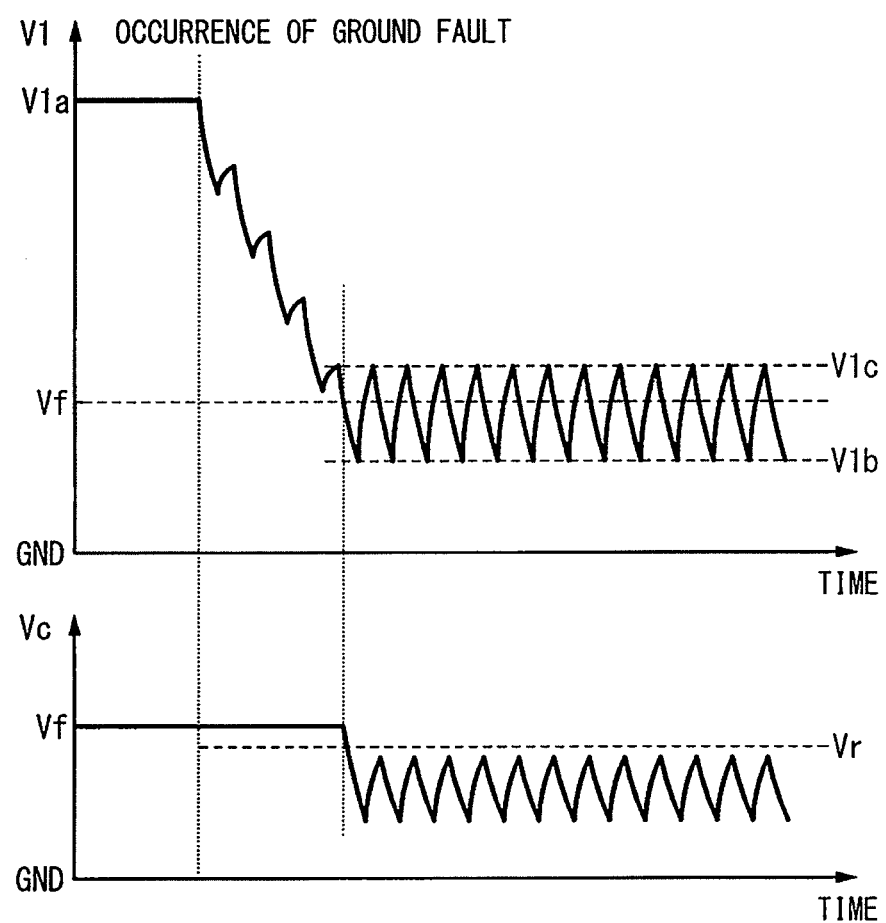
FIG. 3 is an explanatory drawing for examples of changes with time of an output voltage V1 from a DC power supply circuit and a voltage Vc across a capacitor of a ground-fault determining circuit, when a ground fault has occurred at a post-stage of the DC power supply circuit in the power supply device of the embodiment.
Figure 4:
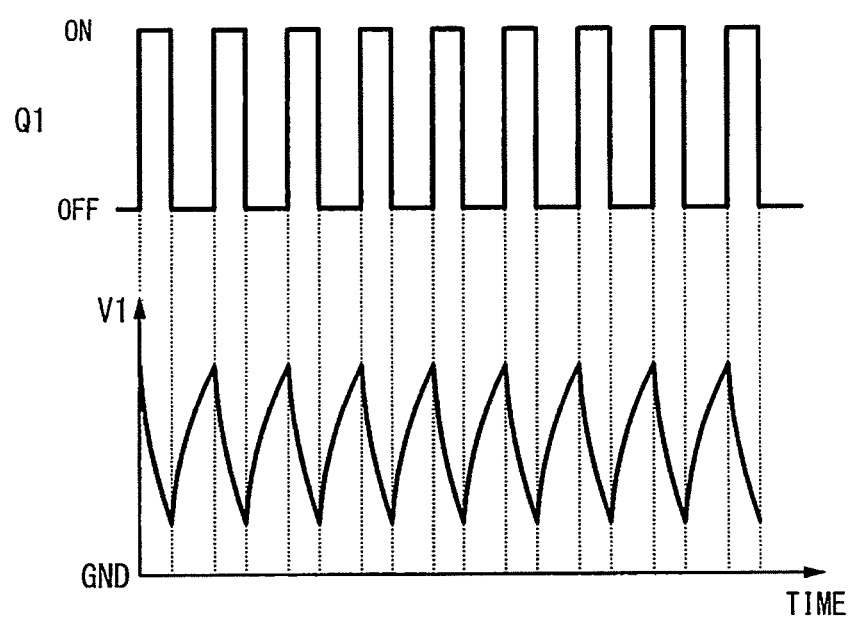
FIG. 4 is an explanatory drawing for examples of changes with time of on/off states of a switching element Q1 in the DC power supply circuit and the output voltage V1 from the DC power supply circuit, in a state where the ground fault is present at the post-stage of the DC power supply circuit in the power supply device of the embodiment.

The ground-fault determining circuit 2 of the embodiment will be described below. The ground-fault determining circuit 2 includes a constant voltage source 20 and a capacitor C2. One end of the capacitor C2 is connected with the constant voltage source 20 via a resistor R21 for charging, and another end thereof is connected with ground. In other words, an output voltage from the constant voltage source 20 corresponds to a charging voltage to be used for charging the capacitor C2. The ground-fault determining circuit 2 further includes a diode D21 and a comparator CP. The diode D21 includes an anode connected with the capacitor C2 via a resistor R22 for discharging, and a cathode connected with an output end on a high voltage side of the DC power supply circuit 1. The comparator CP corresponds to a determining portion, and is configured to compare a voltage Vc across the capacitor C2 (hereinafter, referred to as a "determination voltage") with a prescribed value "Vr" of a determination reference voltage. Here, as shown in FIG. 3, the output voltage V1 from the DC power supply circuit 1 is kept almost constant at a voltage value "V1a" while the ground fault is absent, and as shown in FIG. 4 repeatedly increased and decreased in synchronization with on/off of the switching element Q1 of the DC power supply circuit 1 while the ground fault is present. An upper limit value "V1c" of the output voltage V1 from the DC power supply circuit 1 while the ground fault is present is lower than the voltage value "V1a" of the output voltage V1 from the DC power supply circuit 1 while the ground fault is absent. A voltage value "Vf" of the above-mentioned charging voltage is surely lower than the voltage value "V1a" of the output voltage V1 from the DC power supply circuit 1 while the ground fault is absent, and surely higher than a lower limit value "V1b" of the output voltage V1 from the DC power supply circuit 1 while the ground fault is present. The lower limit value "V1b" (of the output voltage V1 from the DC power supply circuit 1 while the ground fault is present) is determined depending on an impedance of an electric circuit which a ground fault current flows through. The prescribed voltage value "Vr" of the determination reference voltage is lower than the voltage value "Vf" of the charging voltage, and surely higher than a voltage value of the determination voltage Vc while the ground fault is present. Because the constant voltage source 20 can be realized by using a well-known art, detailed explanations thereof will be omitted. The prescribed voltage value "Vr" of the determination reference voltage is generated by, for example, dividing an output voltage from the constant voltage source 20.

Operation of the ground-fault determining circuit 2 will be described. While the ground fault is absent, the determination voltage Vc is kept at almost the output voltage from the constant voltage source 20, and thereby, an output from the comparator CP is made to be at a low level. Accordingly, it is determined that the ground fault is absent.

On the other hand, as shown in FIG. 3, according to the occurrence of the ground fault, a peak value of the output voltage V1 from the DC power supply circuit 1 is reduced below the output voltage from the constant voltage source 20. As a result, discharge of the capacitor C2 is performed via the resistor R22 for discharging and the diode D21, and the determination voltage Vc is reduced below the prescribed voltage value "Vr" of the determination reference voltage, and thereby, the output from the comparator CP is made to be at a high level. Accordingly, it is determined that the ground fault has occurred.

Figure 5:
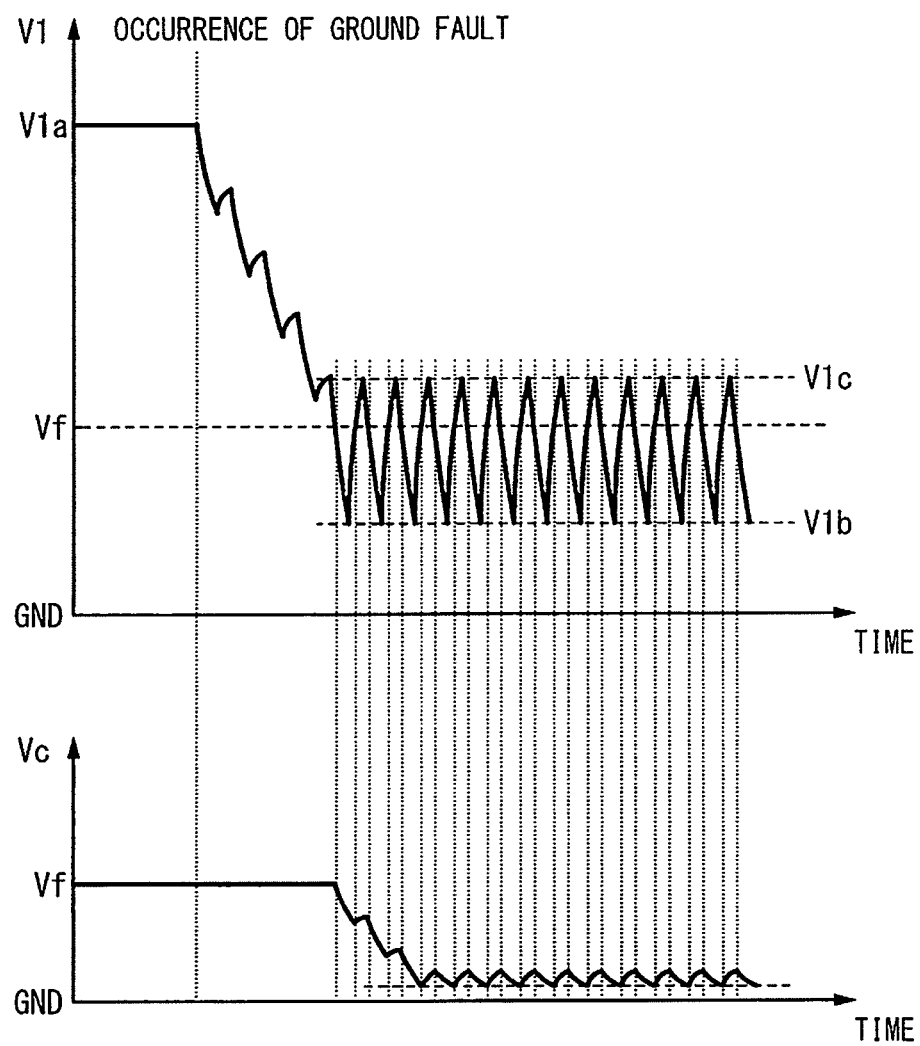
FIG. 5 is an explanatory drawing for another examples of changes with time of the output voltage V1 from the DC power supply circuit and the voltage Vc across the capacitor of the ground-fault determining circuit, when the ground fault has occurred at the post-stage of the DC power supply circuit in the power supply device of the embodiment.

In the embodiment, the resistor R21 for charging has a resistance value higher than a resistance value of the resistor R22 for discharging. In other words, a time constant of an electric circuit for charging is higher than that for discharging. Accordingly, even when a difference between the output voltage from the constant voltage source 20 and the determination voltage Vc is equal to a difference between the determination voltage Vc and the output voltage V1 from the DC power supply circuit 1, an amount of discharge from the capacitor C2 exceeds an amount of charge to the capacitor C2, and the determination voltage Vc is reduced. When a time constant depending on the resistor R22 for discharging is high with respect to a frequency of an output from the DC power supply circuit 1, there is also a case where the determination voltage Vc is reduced as the whole while being oscillated, until the amplitude of the determination voltage Vc becomes stabilized after occurrence of the ground fault, as shown in FIG. 5.

A determination result by the ground-fault determining circuit 2 (i.e., an output from the comparator CP) is input to the inverter drive circuit 30. The inverter drive circuit 30 turns off all of the switching elements Q31 to Q34 so as to stop the power supplying to the discharge lamp 5 as the load, when the ground-fault determining circuit 2 determines that the ground fault has occurred (i.e., when an output from the ground-fault determining circuit 2 is at a high level). Each of the switching elements Q31 to Q34 corresponds to a cut-off circuit, and the inverter drive circuit 30 corresponds to an off-switching circuit.

According to the above-mentioned configuration, the determination voltage Vc (i.e., the voltage across the capacitor C2) is more stable than the output voltage V1 from the DC power supply circuit 1. Therefore, it is possible to more suppress erroneous determination of the ground fault, compared with a case of directly comparing the output voltage V1 from the DC power supply circuit 1 with a reference voltage to determine the presence or absence of the ground fault.

In addition, the output is not restarted, when it is determined that the ground fault has occurred. Therefore, it is possible to prevent an overcurrent more surely, compared with a case of repeating, twice or more times, stopping and restarting of the output due to determination of the ground fault.

Figure 6:
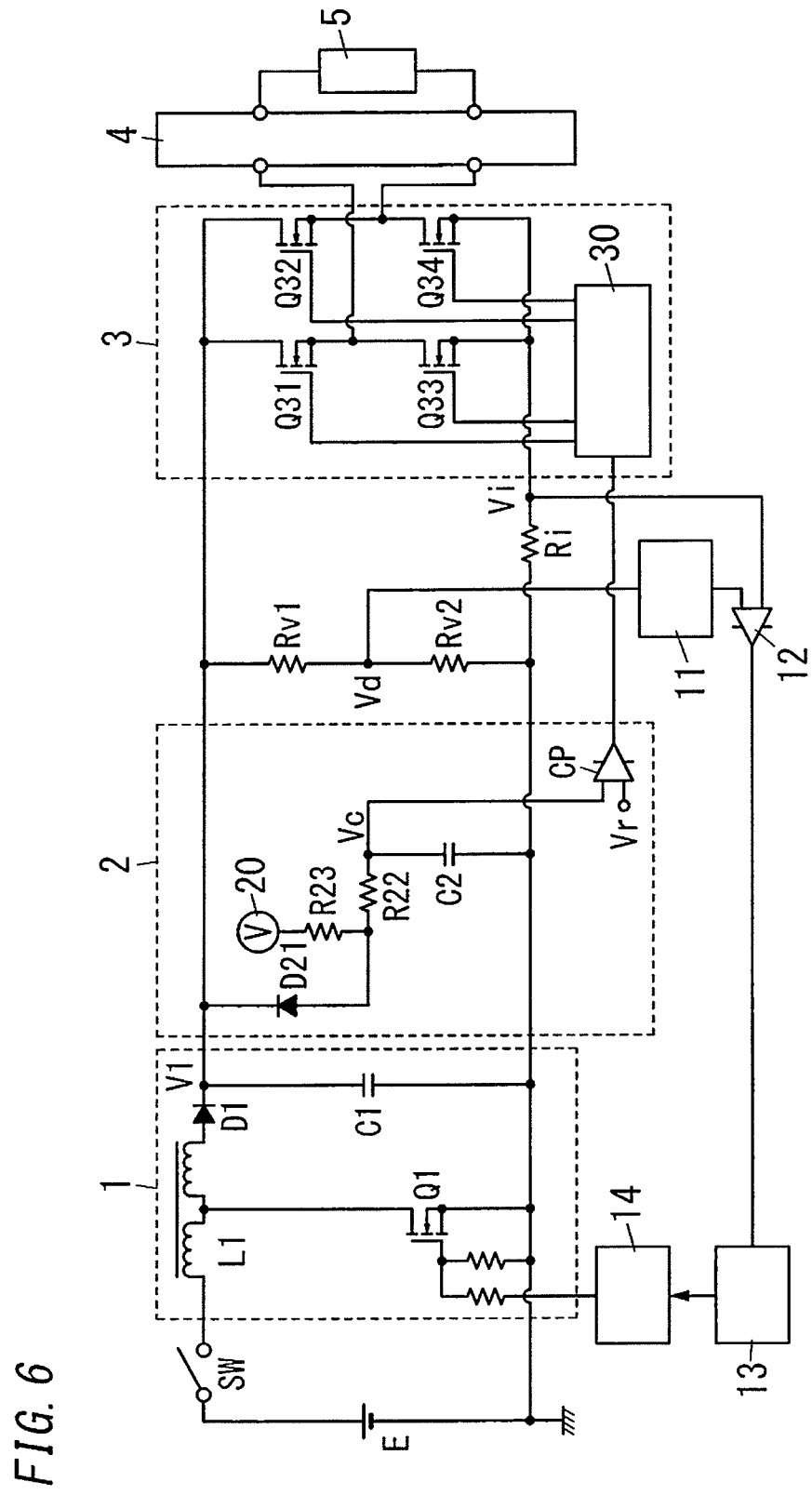
FIG. 6 is a circuit block diagram illustrating a variation of the power supply device of the embodiment.

Note that as shown in FIG. 6, a resistor R23 for only charging, which is connected with a connecting point of a diode D21 and a resistor R22 for discharging, may be provided instead of the resistor R21 for charging directly connected with the capacitor C2. In this case, a series circuit of the resistor R22 for discharging and the resistor R23 for only charging corresponds to a resistor for charging, and accordingly, a resistance value of the resistor for charging is surely higher than that of the resistor R22 for discharging.

Figure 7:
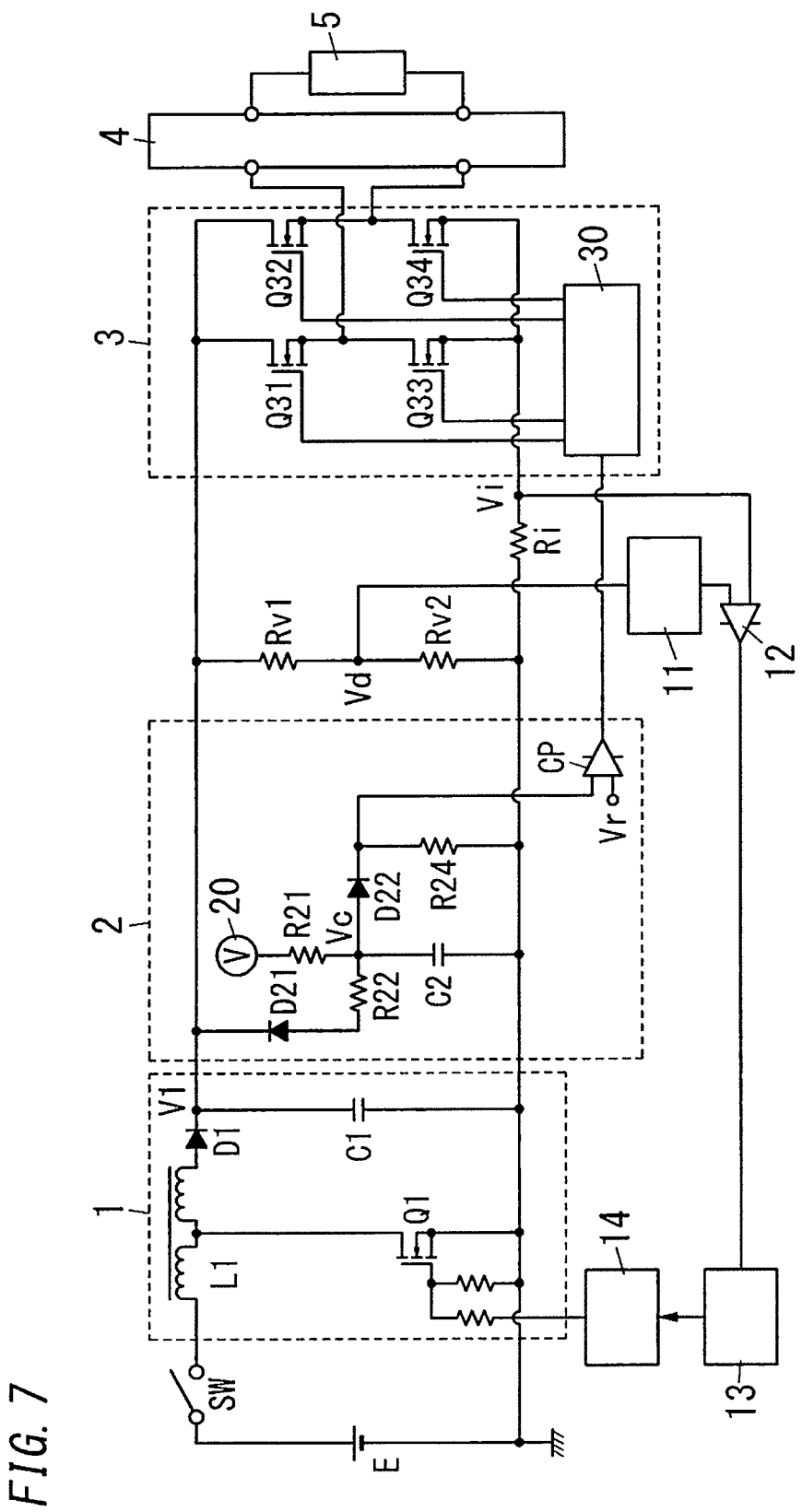
FIG. 7 is a circuit block diagram illustrating another variation of the power supply device of the embodiment.
Figure 8:
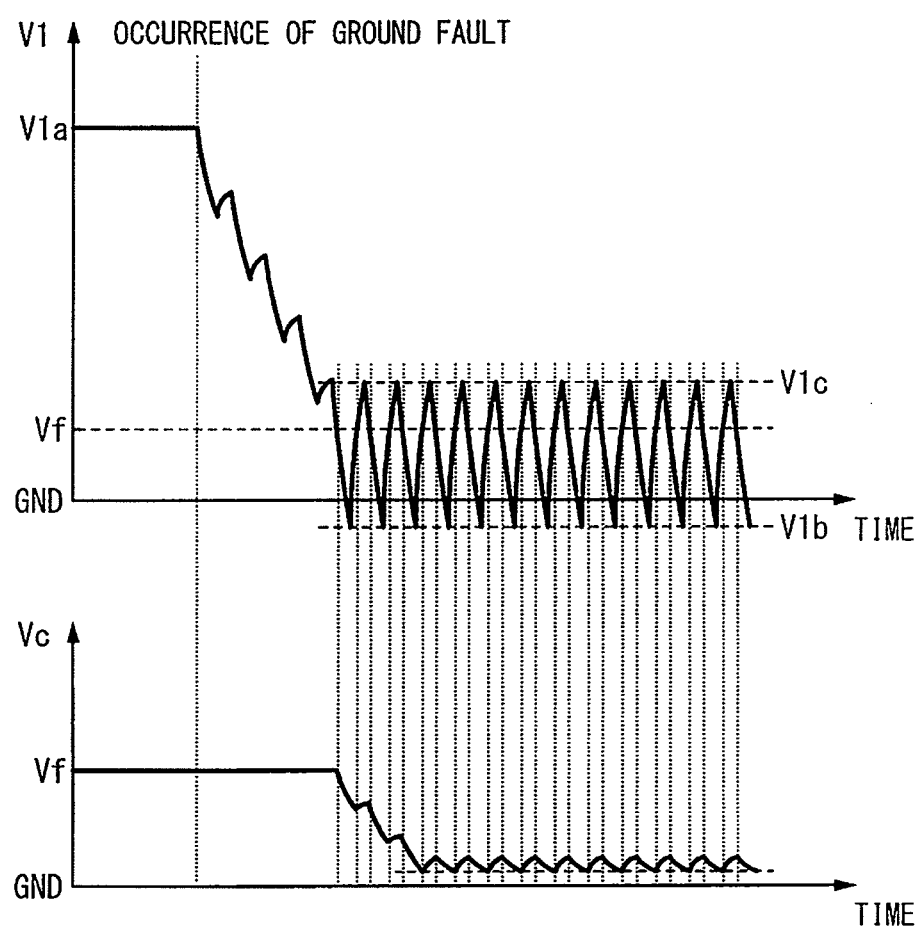
FIG. 8 is an explanatory drawing for examples of changes with time of the output voltage V1 from the DC power supply circuit and the voltage Vc across the capacitor of the ground-fault determining circuit, when the ground fault has occurred at the post-stage of the DC power supply circuit in the another variation of FIG. 7.

As shown in FIG. 7, a series circuit of a diode D22 and a resistor R24 may be provided so as to be connected in parallel with a capacitor C2. In this case, an anode of the diode D22 is connected with the capacitor C2 and a resistor R21 for charging. In other words, a charging voltage Vf in the example of FIG. 7 is not an output voltage from a constant voltage source 20, but a voltage obtained by dividing the output voltage from the constant voltage source 20 with the resistor R21 for charging and the series circuit. In addition, a comparator CP is connected with the capacitor C2 via the diode D22, instead of being directly connected with the capacitor C2. According to the configuration shown in FIG. 7, even when the lower limit value V1b of the output voltage V1 from the DC power supply circuit 1 is a negative voltage as shown in FIG. 8, it is possible to prevent the negative voltage from being input to the comparator CP. Therefore, a comparator in which an input of a negative voltage is inhibited can be used as the comparator CP.

Figure 9:
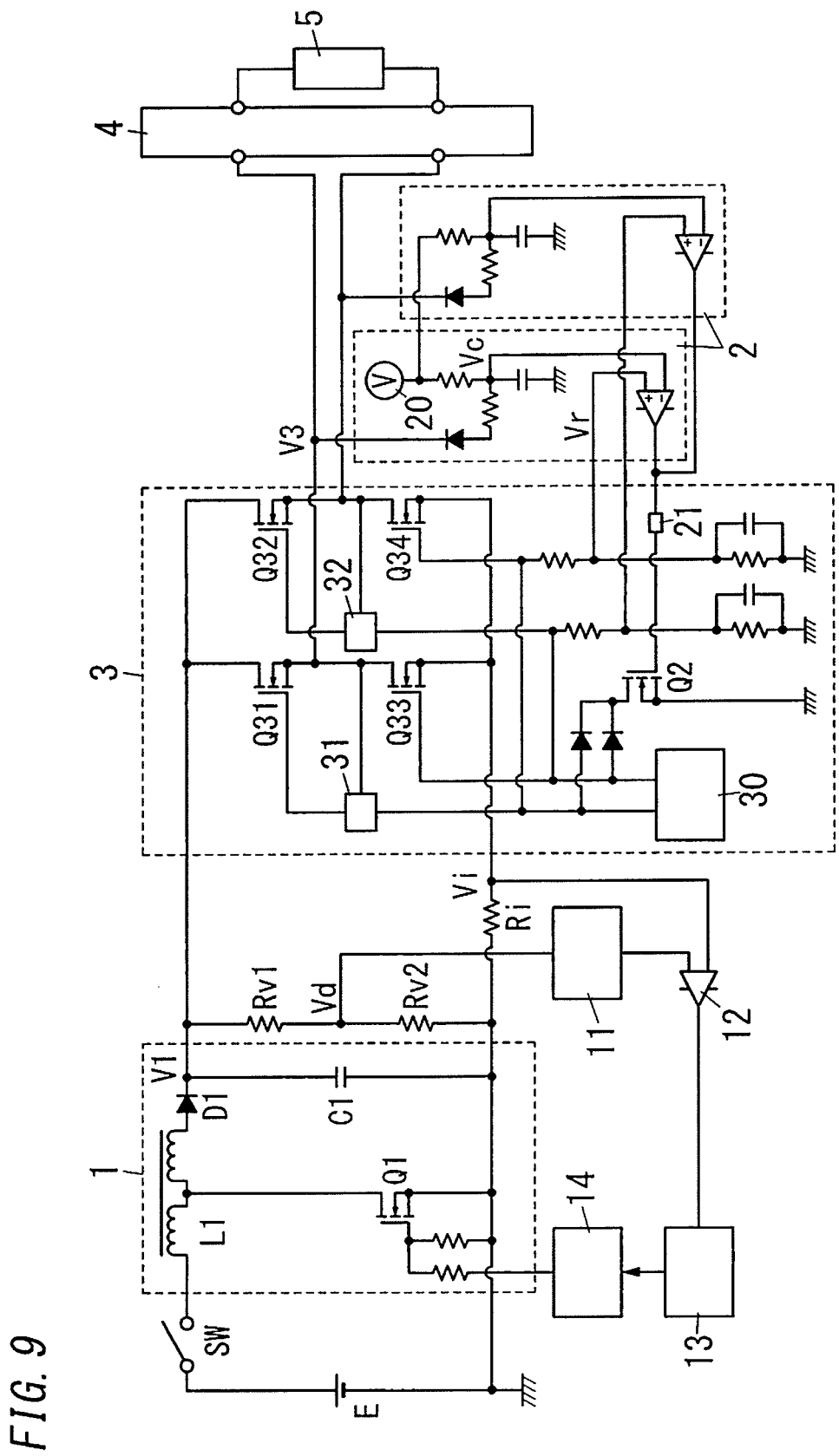
FIG. 9 is a circuit block diagram illustrating yet another variation of the power supply device of the embodiment.

As shown in FIG. 9, a ground-fault determining circuit 2 may be provided at a post-stage of an inverter circuit 3. In the example of FIG. 9, two ground-fault determining circuits 2 in total are provided to respectively correspond to polarities of outputs from the inverter circuit 3. In this case, a constant voltage source 20 is shared between the two ground-fault determining circuits 2. In each ground-fault determining circuit 2, a prescribed value "Vr" of a determination reference voltage is generated by dividing a control voltage output from an inverter drive circuit 30 with a resistor, and smoothing the divided voltage with a capacitor. Here, if the control voltage or the divided voltage is directly used as the determination reference voltage, the determination reference voltage may rise before rising of a determination voltage Vc immediately after switching of the polarities of the outputs from the inverter circuit 3, and accordingly, an output from a comparator CP may be temporarily at a high level. In order to prevent this issue, in the example of FIG. 9, a capacitor is connected in parallel with a resistor on a low voltage side of resistors for dividing the control voltage so that the determination reference voltage does not exceed the determination voltage Vc immediately after switching of the polarities of the outputs from the inverter circuit 3, and accordingly, rising of the determination reference voltage is made to be delayed.

Figure 10:
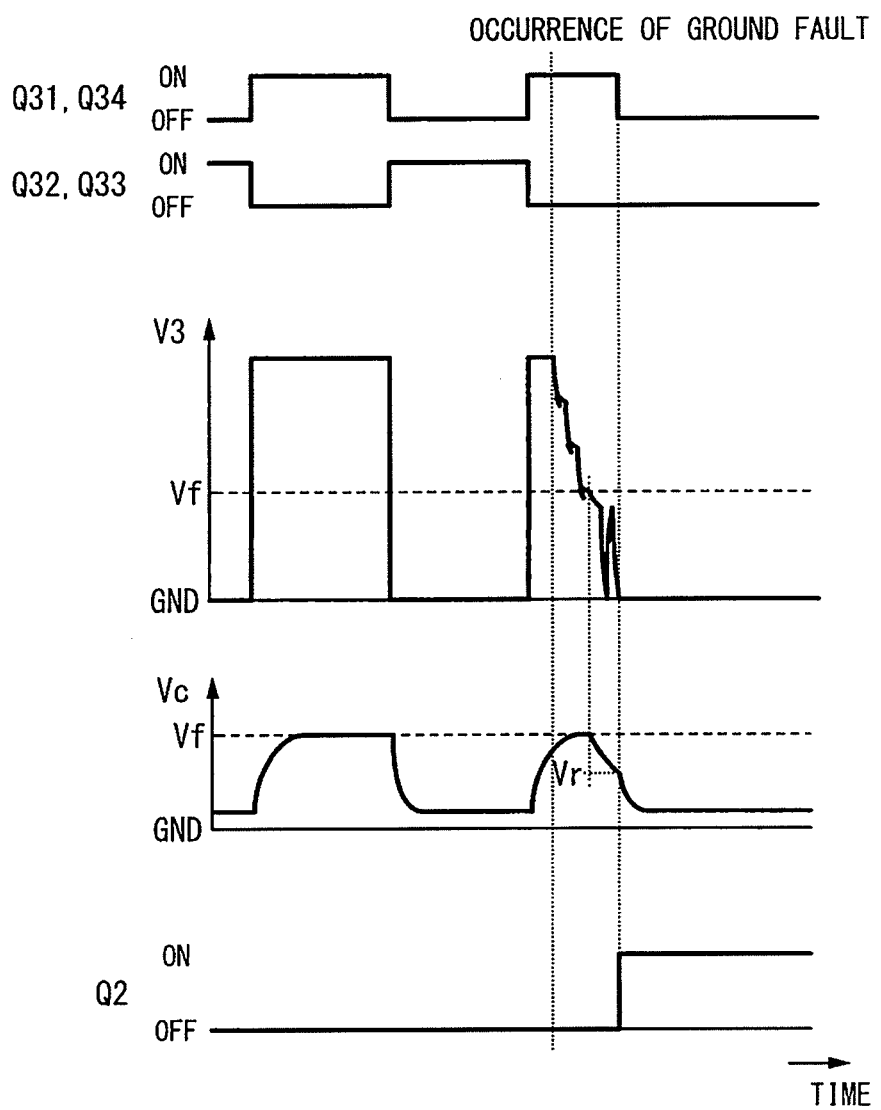
FIG. 10 is an explanatory drawing for examples of changes with time of a voltage V3 between ground and an output end of the inverter circuit, the voltage Vc across the capacitor of the ground-fault determining circuit, connected with the output end, and on/off states of a switching element Q2, when the ground fault has occurred at the post-stage of the DC power supply circuit in the yet another variation of FIG. 9.

Furthermore, in the example of FIG. 9, outputs from the ground-fault determining circuits 2 are input to a gate of a switching element Q2 via a latching circuit 21, instead of being input to the inverter drive circuit 30. The switching element Q2 is a Field Effect Transistor, and corresponds to an off-switching circuit. One end of the switching element Q2 is connected with control terminals (gates) of switching elements Q31 to Q34 in the inverter circuit 3 via diodes provided so as to respectively correspond to the polarities, and another end of the switching element Q2 is connected with ground. The inverter circuit 3 is further provided with high-side drivers 31, 32 that are configured to convert control voltages received from the inverter drive circuit 30 into gate-source voltages for driving the switching elements Q31, Q32 on high voltage sides (high-side), respectively. Note that, in each of the examples of FIGS. 1, 6 and 7, the high-side drivers 31, 32 are provided in the inverter drive circuit 30. As shown in FIG. 10, when any of the ground-fault determining circuits 2 detects a ground fault, the switching element Q2 is turned on, and accordingly, all of the switching elements Q31 to Q34 in the inverter circuit 3 are maintained in off-states. After the switching element Q2 is turned on, the determination reference voltage falls to zero. However, the switching element Q2 is maintained in an on-state by the latching circuit 21, regardless of a change in an output from each ground-fault determining circuit 2 due to the falling of the determination reference voltage. Because the latching circuit 21 as described above can be realized by using a well-known art, detailed drawings and explanations thereof will be omitted.

Figure 11:
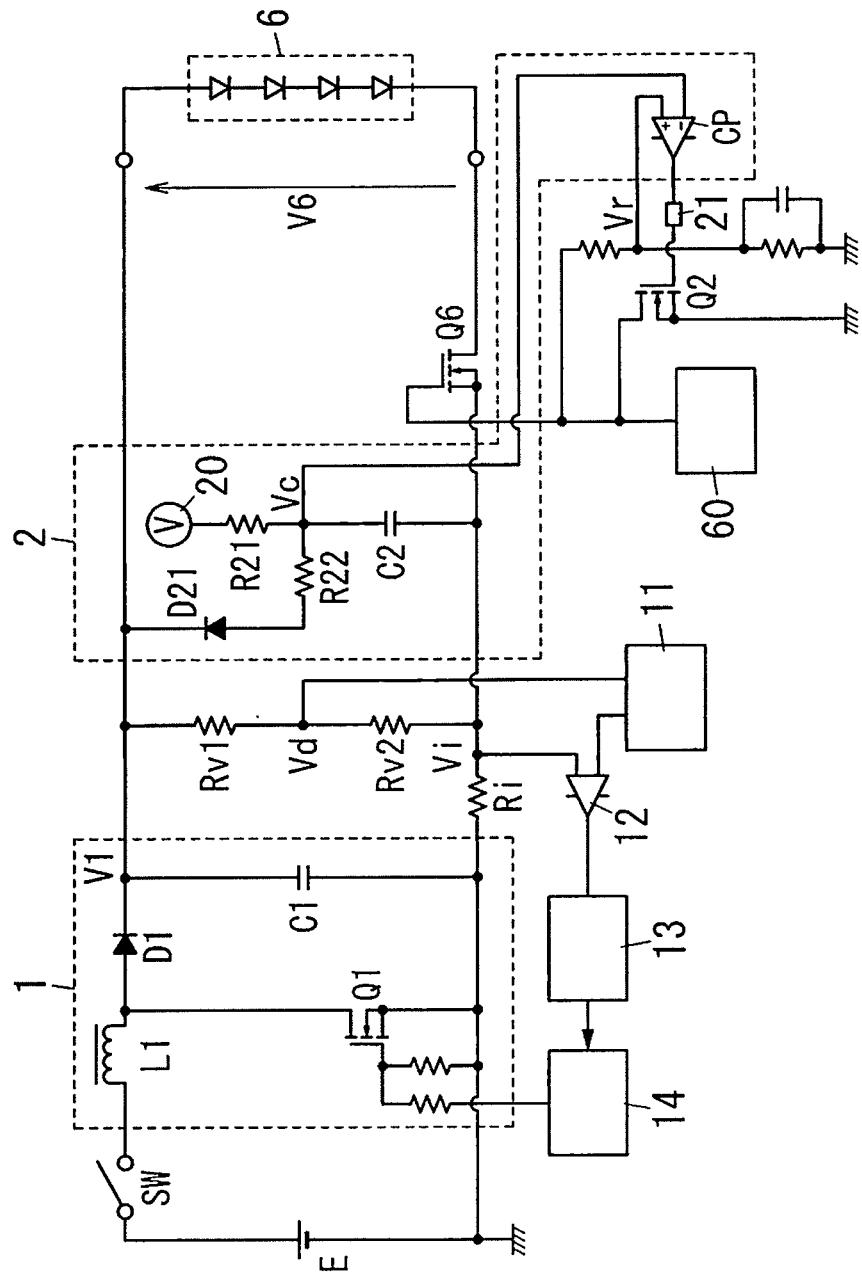
FIG. 11 is a circuit block diagram illustrating yet another variation of the power supply device of the embodiment.
Figure 12:
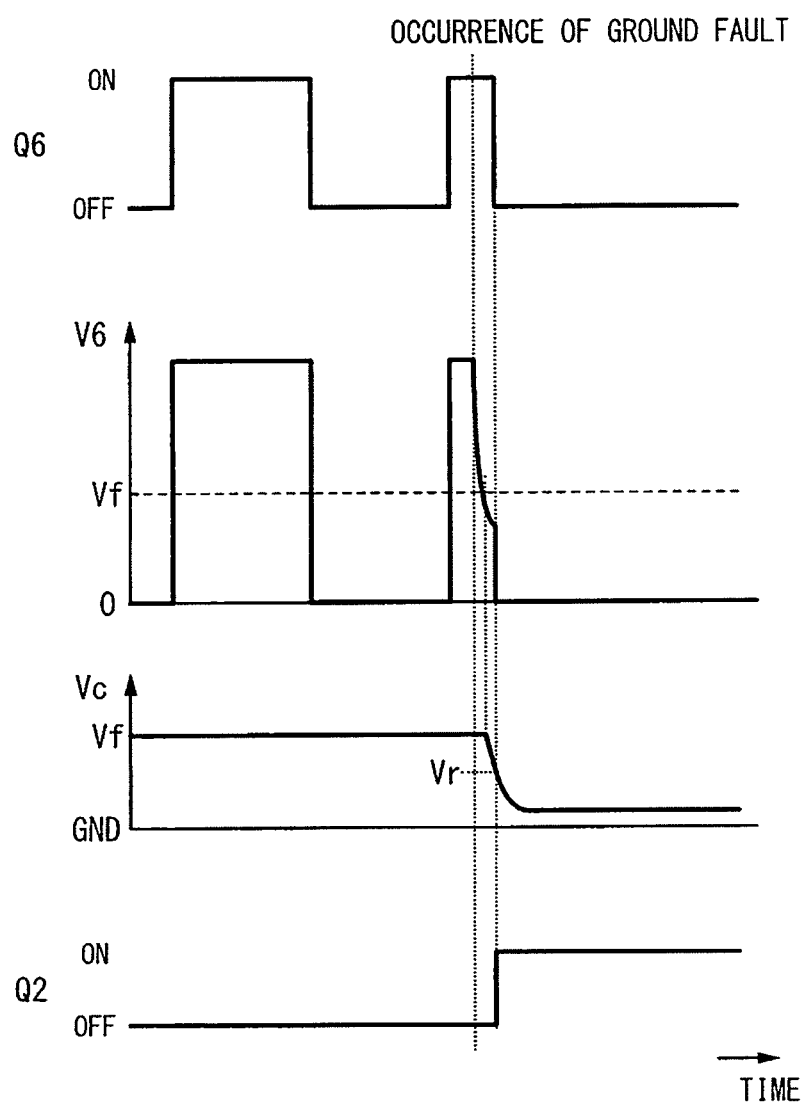
FIG. 12 is an explanatory drawing for examples of changes with time of on/off states of a switching element Q6 for intermittent lighting, a voltage V6 input to a light emitting diode array, the voltage Vc across the capacitor of the ground-fault determining circuit, and on/off states of the switching element Q2, when the ground fault has occurred at the post-stage of the DC power supply circuit in the yet another variation of FIG. 11.

As shown in FIG. 11, a light emitting diode array 6 may be lighted using an output from a DC power supply circuit 1, instead of the discharge lamp 5 being lighted using the inverter circuit 3 and the igniter circuit 4 as above. The DC power supply circuit 1 in the example of FIG. 11 includes, as an inductor L1, a normal coil instead of the autotransformer, and a boosting ratio is set to be relatively low. Further in the example of FIG. 11, a switching element Q6 and a switch control circuit 60 are provided. The switching element Q6 corresponds to a cut-off circuit, and is a Field Effect Transistor that is connected in series with the light emitting diode array 6. The switch control circuit 60 is configured to turn on/off the switching element Q6. The switch control circuit 60 is configured to receive an input from an external, and turn on/off the switching element Q6 with a duty ratio according to the input so as to intermittently light the light emitting diode array 6. A frequency of the above-mentioned on/off drive is sufficiently high to an extent that the above-mentioned intermittent lighting cannot be recognized as flashing with human eyes. The apparent brightness of the light emitting diode array 6 is proportional to the duty ratio. A gate as a control terminal of the switching element Q6 is connected with ground via a switching element Q2 corresponding to an off-switching circuit. Similarly to the example of FIG. 9, an output voltage from the ground-fault determining circuit 2 (comparator CP) is input to a gate of the switching element Q2 as the off-switching circuit via a latching circuit 21. In this case, a prescribed value "Vr" of a determination reference voltage is generated by a control voltage input to the gate of the switching element Q6 from the switch control circuit 60 being divided with a resistor, and a divided voltage being smoothed with a capacitor. As shown in FIG. 12, when a ground fault is detected, the switching element Q2 as the off-switching circuit is turned on and accordingly the switching element Q6 as the cut-off circuit is maintained in an off-state. As a result, power supplying to the light emitting diode array 6 as a load is stopped. When turned on, the switching element Q2 is maintained in an on-state by the latching circuit 21, regardless of a change in an output from the comparator CP due to falling of the determination reference voltage after that.

Figure 13:
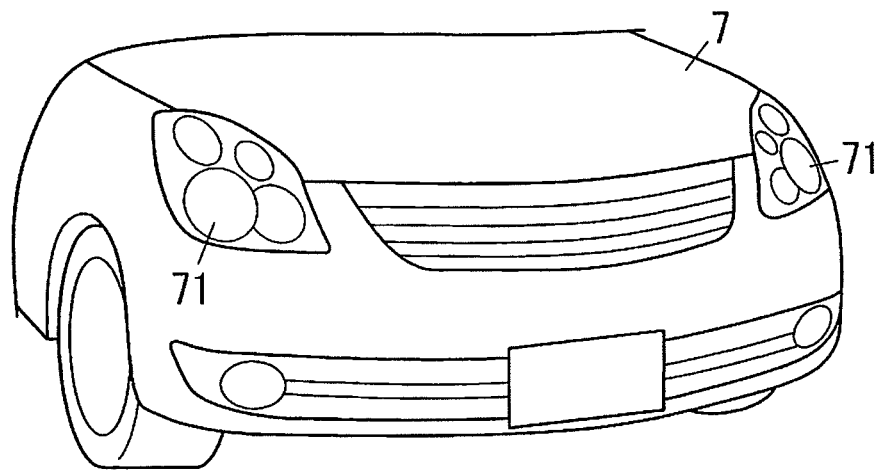
FIG. 13 is a perspective view of a main part of a vehicle that is provided with an illumination device for vehicle using the power supply device of the embodiment.

Each of the power supply devices as described above constitutes an illumination device for vehicle, together with an electric light source as the discharge lamp 5 or the light emitting diode array 6. As an example of this illumination device for vehicle, FIG. 13 shows a headlight device 71 which is mounted to a vehicle 7, using an in-vehicle battery as the DC power supply E, and using the discharge lamp 5 or the light emitting diode array 6 as the light source.

The power supply device of the embodiment as described above includes the DC power supply circuit 1 and the ground-fault determining circuit 2. The DC power supply circuit 1 is configured to output the DC power. The ground-fault determining circuit 2 is configured to determine the presence or absence of the ground fault at the post-stage of the DC power supply circuit 1. The ground-fault determining circuit 2 includes the capacitor C2, the diode D21, the determining portion (comparator CP) and the constant voltage source 20. The capacitor C2 has the end that is connected with the ground. The diode D21 includes the anode and the cathode. The anode is connected with another end of the capacitor C2, and the cathode is connected with the output end on the high voltage side of the DC power supply circuit 1. The determining portion (comparator CP) is configured to determine the presence or absence of the ground fault based on the voltage across the capacitor C2. The constant voltage source 20 is configured to charge the capacitor C2 with the prescribed charging voltage. The prescribed charging voltage is lower than the output voltage from the DC power supply circuit 1 in the state where the ground fault is absent and power supplying is normally performed from the DC power supply circuit 1 to the load (the discharge lamp 5 or the light emitting diode array 6). The determining portion is configured to determine the presence of the ground fault when the voltage across the capacitor C2 falls below the prescribed determination reference voltage that is lower than the prescribed charging voltage.

When the ground-fault determining circuit 2 determines the presence of the ground fault, the power supply device of the embodiment is preferably configured to stop the power supplying from the DC power supply circuit 1 to the load.

As the power supply device of the embodiment, the prescribed charging voltage is preferably higher than the minimum value of the output voltage from the DC power supply circuit 1 in the state where the ground fault is present at the post-stage of the DC power supply circuit 1.

The power supply device of the embodiment preferably further includes the resistor for charging (the resistor R21 for charging, or the resistor R23 for charging), and the resistor R22 for discharging. In this case, preferably, the resistor for charging is electrically connected across the constant voltage source 20 and the capacitor C2, and the resistor R22 for discharging is connected in series with the diode D21, and the resistor for charging has the resistance value higher than the resistance value of the resistor R22 for discharging.

The power supply device of the embodiment preferably further includes the cut-off circuit configured to cut off the power supplying from the DC power supply circuit 1 to the load, when the ground-fault determining circuit 2 determines the presence of the ground fault.

As the power supply device of the embodiment, the cut-off circuit preferably includes the switching element Q6 electrically connected between the DC power supply circuit 1 and the load. In this case, the power supply device of the embodiment preferably further includes the control circuit (the switch control circuit 60) and the off-switching circuit (the switching element Q2). The control circuit (the switch control circuit 60) is configured to output the prescribed control voltage to the control terminal of the switching element Q6 so as to turn on the switching element Q6. The off-switching circuit (the switching element Q2) is configured to reduce the potential of the control terminal of the switching element Q6 so as to turn off the switching element Q6, when the ground-fault determining circuit 2 determines the presence of the ground fault. The prescribed determination reference voltage depends on the prescribed control voltage.

As the power supply device of the embodiment, the cut-off circuit preferably includes the full bridge inverter circuit 3 that is provided with the four switching elements Q31 to Q34.

The illumination device for vehicle of the embodiment includes any one of the above-mentioned power supply devices, and the light source (the discharge lamp 5 or the light emitting diode array 6) of emitting light with the output from the power supply device.

Although the invention has been described with reference to certain preferred embodiments, numerous modifications and variations can be made by those skilled in the art without departing from the true spirit and scope of this invention, namely claims.

The invention claimed is:

1. A power supply device, comprising:
   a DC power supply circuit configured to output DC power; and
   a ground-fault determining circuit configured to determine presence or absence of a ground fault at a post-stage of the DC power supply circuit,
   the ground-fault determining circuit comprising:
   a capacitor, of which an end being connected with ground;
   a diode including an anode and a cathode, the anode being connected with another end of the capacitor, the cathode being connected with an output end on a high voltage side of the DC power supply circuit;
   a determining portion configured to determine the presence or absence of the ground fault based on a voltage across the capacitor; and
   a constant voltage source configured to charge the capacitor with a prescribed charging voltage,
   the prescribed charging voltage being lower than an output voltage from the DC power supply circuit in a state where the ground fault is absent and power supplying is normally performed from the DC power supply circuit to a load, and
   the determining portion being configured to determine the presence of the ground fault when the voltage across the capacitor falls below a prescribed determination reference voltage that is lower than the prescribed charging voltage.

2. The power supply device according to claim 1, wherein when the ground-fault determining circuit determines the presence of the ground fault, the power supply device is configured to stop the power supplying from the DC power supply circuit to the load.

3. The power supply device according to claim 1, wherein the prescribed charging voltage is higher than a minimum value of an output voltage from the DC power supply circuit in a state where the ground fault is present at the post-stage of the DC power supply circuit.

4. The power supply device according to claim 1, further comprising:
   a resistor for charging, electrically connected across the constant voltage source and the capacitor; and
   a resistor for discharging, connected in series with the diode,
   the resistor for charging having a resistance value higher than a resistance value of the resistor for discharging.

5. The power supply device according to claim 1 further comprising a cut-off circuit configured to cut off the power supplying from the DC power supply circuit to the load, when the ground-fault determining circuit determines the presence of the ground fault.

6. The power supply device according to claim 5, wherein the cut-off circuit includes a switching element electrically connected between the DC power supply circuit and the load, the power supply device further comprising:
  a control circuit configured to output a prescribed control voltage to a control terminal of the switching element so as to turn on the switching element; and
  an off-switching circuit configured to reduce a potential of the control terminal of the switching element so as to turn off the switching element, when the ground-fault determining circuit determines the presence of the ground fault,
  the prescribed determination reference voltage depending on the prescribed control voltage.

7. The power supply device according to claim 5, wherein the cut-off circuit comprises a full bridge inverter circuit that comprises four switching elements.

8. An illumination device for vehicle, comprising:
  the power supply device according to claim 1; and
  a light source of emitting light with an output from the power supply device.

9. The power supply device according to claim 2, wherein the prescribed charging voltage is higher than a minimum value of an output voltage from the DC power supply circuit in a state where the ground fault is present at the post-stage of the DC power supply circuit.

10. The power supply device according to claim 2, further comprising:
  a resistor for charging, electrically connected across the constant voltage source and the capacitor; and
  a resistor for discharging, connected in series with the diode,
  the resistor for charging having a resistance value higher than a resistance value of the resistor for discharging.

11. The power supply device according to claim 3, further comprising:
  a resistor for charging, electrically connected across the constant voltage source and the capacitor; and
  a resistor for discharging, connected in series with the diode,
  the resistor for charging having a resistance value higher than a resistance value of the resistor for discharging.

12. The power supply device according to claim 9, further comprising:
  a resistor for charging, electrically connected across the constant voltage source and the capacitor; and
  a resistor for discharging, connected in series with the diode,
  the resistor for charging having a resistance value higher than a resistance value of the resistor for discharging.

* * * * *